(12) United States Patent  
Ng et al.

(10) Patent No.: US 8,884,369 B2  
(45) Date of Patent: Nov. 11, 2014

(54) VERTICAL POWER MOSFET AND METHODS OF FORMING THE SAME

(75) Inventors: Chun-Wai Ng, Hsin-Chu (TW); Hsueh-Liang Chou, Jhubei (TW); Ruey-Hsin Liu, Hsin-Chu (TW); Po-Chih Su, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/486,633

(22) Filed: Jun. 1, 2012

(65) Prior Publication Data

US 2013/0320430 A1    Dec. 5, 2013

(51) Int. Cl.  
*H01L 29/66*    (2006.01)

(52) U.S. Cl.  
USPC .......................................... 257/341; 257/355

(58) Field of Classification Search  
None  
See application file for complete search history.

(56) References Cited

U.S. PATENT DOCUMENTS

| | | | |
|---|---|---|---|
| 7,638,841 B2* | 12/2009 | Challa | 257/341 |
| 8,013,391 B2* | 9/2011 | Yedinak et al. | 257/340 |
| 8,304,829 B2* | 11/2012 | Yedinak et al. | 257/334 |
| 2003/0122195 A1 | 7/2003 | Tada et al. | |
| 2003/0227052 A1 | 12/2003 | Ono et al. | |
| 2007/0023830 A1* | 2/2007 | Pfirsch et al. | 257/341 |
| 2008/0246086 A1 | 10/2008 | Korec et al. | |
| 2012/0220091 A1* | 8/2012 | Challa et al. | 438/270 |
| 2013/0082321 A1* | 4/2013 | Sobti et al. | 257/329 |

FOREIGN PATENT DOCUMENTS

| | | |
|---|---|---|
| JP | 2005072356 | 3/2005 |
| KR | 20030045642 | 8/2007 |

OTHER PUBLICATIONS

Xu et al., "Dummy Gated Radio Frequency VDMOSFET with High Breakdown Voltage and Low Feedback Capacitance," Proceedings of the 12th International Symposium on Power Semiconductor Devices and ICs, ISPSO '2000, IEEE, Toulouse, France May 22-25, 2000, pp. 385-388.

* cited by examiner

*Primary Examiner* — Matthew W Such  
*Assistant Examiner* — Stephen C Smith  
(74) *Attorney, Agent, or Firm* — Slater & Matsil, L.L.P.

(57) ABSTRACT

A device includes a semiconductor layer of a first conductivity type, and a first and a second body region over the semiconductor layer, wherein the first and the second body regions are of a second conductivity type opposite the first conductivity type. A doped semiconductor region of the first conductivity type is disposed between and contacting the first and the second body regions. A gate dielectric layer is disposed over the first and the second body regions and the doped semiconductor region. A first and a second gate electrode are disposed over the gate dielectric layer, and overlapping the first and the second body regions, respectively. The first and the second gate electrodes are physically separated from each other by a space, and are electrically interconnected. The space between the first and the second gate electrodes overlaps the doped semiconductor region.

19 Claims, 9 Drawing Sheets

VERTICAL POWER MOSFET AND METHODS OF FORMING THE SAME

BACKGROUND

In a conventional vertical power Metal-Oxide-Semiconductor Field Effect Transistor (MOSFET), two p-body regions are formed in an n-type epitaxy region. The vertical power MOSFET are such named since its source and drain regions are overlapped. A portion of the epitaxy region between the two p-body regions is lightly doped to form an n-type doped region, which is sometimes known as an N-type Junction Field Effect Transistor (n-JFET) region. The p-body regions and the n-JFET region are under a gate dielectric and a gate electrode. When the gate is applied with a positive voltage, inversion regions of electrons are formed in the p-body regions. The inversion regions act as the channel regions that connect the source region of the vertical power MOSFET to the n-JFET region, which is further connected to the drain region of the power MOSFET through the n-type epitaxy region. Accordingly, a source-to-drain current is conducted from the source region to the channels in the p-body regions, the n-JFET region, the epitaxy region, and then to the drain region.

The n-JFET region is underlying the gate electrode, with the gate dielectric layer disposed between the n-JFET region and the gate electrode. There is a large overlap area between the gate electrode and the n-JFET region. As a result, there is a significant gate-to-drain capacitance, which adversely affects the performance, including the speed, of the vertical MOSFET. Furthermore, the n-JFET region is lightly doped since is it a part of the n-type epitaxy region. The resistance of the n-JFET region is thus high, which adversely affects the drive current of the vertical power MOSFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A vertical power Metal-oxide-Semiconductor Field Effect Transistor (MOSFET) and the method of forming the same are provided in accordance with various exemplary embodiments. The intermediate stages of forming the vertical power MOSFET are illustrated. The variations of the embodiments are discussed. Throughout the various views and illustrative embodiments, like reference numbers are used to designate like elements.

Figure 1A:
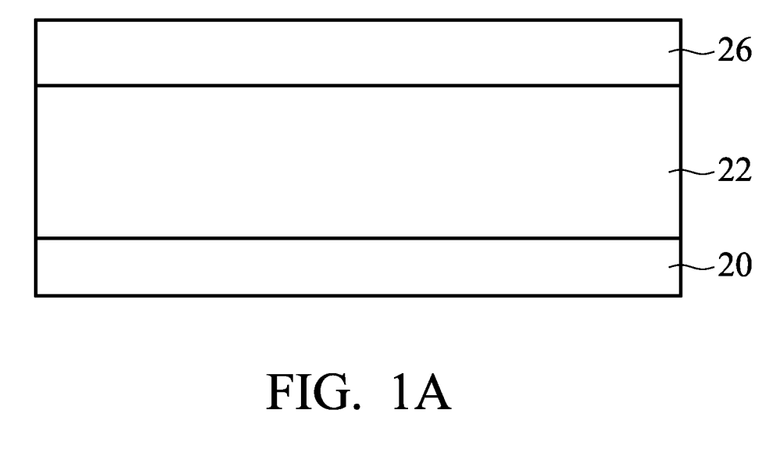
FIGS. 1A through 1F are cross-sectional views of intermediate stages in the manufacturing of a vertical power Metal-Oxide-Semiconductor Field Effect Transistor (MOSFET) in accordance with some exemplary embodiments.

FIGS. 1A through 1F are cross-sectional views of intermediate stages in the formation of an n-type vertical power MOSFET. Referring to FIG. 1A, semiconductor region 20, which is a portion of a semiconductor substrate, is provided. Semiconductor region 20 and the respective semiconductor substrate may have a crystalline silicon structure. Alternatively, semiconductor region 20 and the respective semiconductor substrate may be formed of other semiconductor materials such as silicon germanium. The semiconductor substrate may be a bulk substrate. In some embodiments, semiconductor region 20 is a heavily doped layer doped with an n-type impurity such as phosphorous or arsenic, for example, to an impurity concentration between about $10^{19}/cm^3$ and about $10^{21}/cm^3$. In the described embodiments, the term "heavily doped" means an impurity concentration of above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

Over heavily doped semiconductor region 20, epitaxy layer 22 is formed through epitaxy, and is lightly doped with an n-type impurity. The impurity concentration of epitaxy layer 22 may be between about $10^{15}/cm^3$ and about $10^{18}/cm^3$. Epitaxy layer 22 may be a silicon layer, although other semiconductor material may be used.

Body layer 26 is then formed. Body layer 26 is of p-type, and hence is referred to as p-body 26 hereinafter. In some embodiments, p-body 26 is formed by implanting a top portion of epitaxy layer 22 with a p-type impurity such as boron and/or indium, wherein a bottom portion of epitaxy layer 22 is not implanted, and remains to be of n-type. The p-type impurity concentration of p-body 26 may be between about $10^{15}/cm^3$ and about $10^{18}/cm^3$. The implantation of p-body 26 may include forming a pad oxide layer (not shown) by oxidizing a surface layer of epitaxy layer 22, implanting the p-type impurity through the pad oxide layer to form p-body 26, and then removing the pad oxide layer. In alternative embodiments, p-body 26 is formed by epitaxially growing a semiconductor layer (such as silicon layer) on epitaxy layer 22, and in-situ doping a p-type impurity into p-body 26 when the epitaxy proceeds.

Figure 1B:
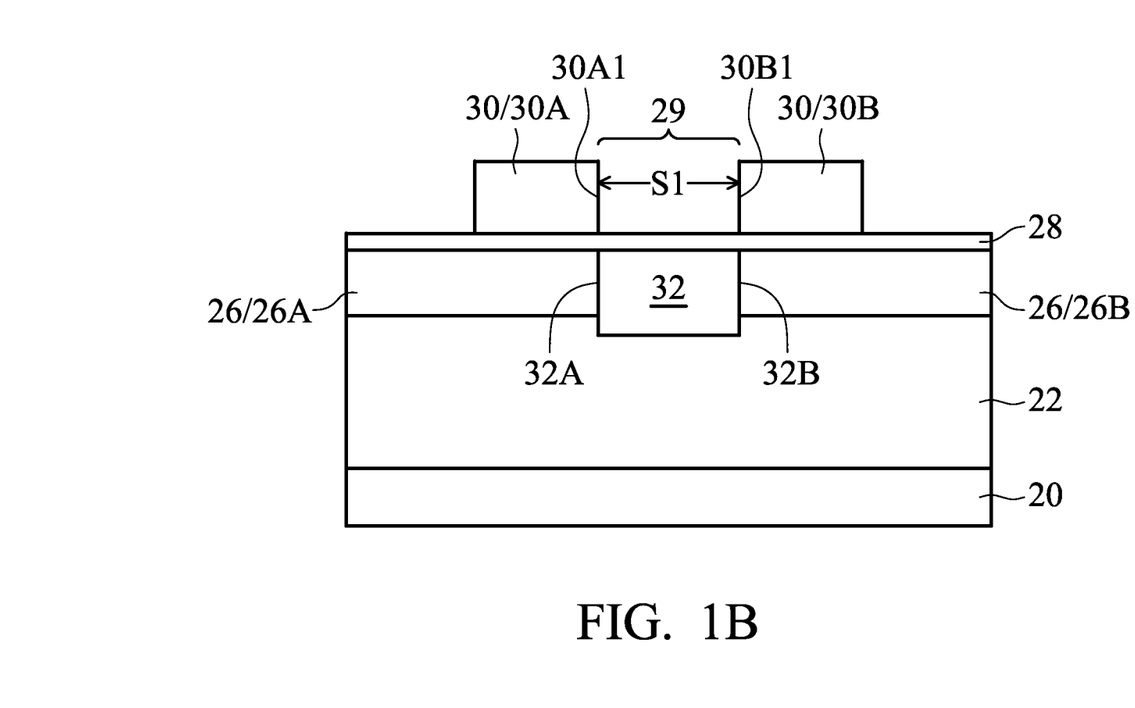

Next, as shown in FIG. 1B, gate oxide layer 28 is formed. In some embodiments, the formation process includes a thermal oxidation of a surface layer of p-body 26. Accordingly, gate oxide layer 28 comprises silicon oxide. In alternative embodiments, gate oxide layer 28 is formed through deposition. The corresponding gate oxide layer 28 may include silicon oxide, silicon nitride, silicon oxynitride, silicon carbide, combinations thereof, and multi-layers thereof.

FIG. 1B also illustrates the formation of gate electrodes 30 (including 30A and 30B). The formation process may include a blanket deposition of a conductive material, and then patterning the conductive material. In some embodiments, gate electrodes 30A and 30B comprise polysilicon, although other conductive materials such as metals, metal silicides, or the like, may also be used. Gate electrodes 30A and 30B are spaced apart from each other by space 29. Spacing S1 between gate electrodes 30A and 30B may be between about 100 nm and about 10 μm nm in some exemplary embodiments. It is appreciated that the values recited throughout the description are merely examples, and may be changed to different values.

Next, an implantation is performed to form n-type doped region 32. N-type doped region 32 is sometimes referred to as an N-type Junction Field Effect Transistor (n-JFET) region, since it functions as a part of a JFET. In the implantation, a photo resist (not shown) may be applied and then patterned, and space 29 between gate electrodes 30A and 30B is exposed, so that the implantation is performed through space 29. The implanted n-type impurity may include phosphorous, arsenic, or the like. At least portions of gate electrodes 30A and 30B may be used as an implantation mask. The implanted n-type impurity neutralizes the p-type impurity in the implanted portion of p-body 26, and converts the implanted portion to n-type. The resulting n-type doped region 32 penetrates through p-body 26, and has a bottom at least contacting, and may extend into, epitaxy layer 22. P-body 26 is thus separated into two portions, namely p-body 26A and p-body 26B. The impurity concentration of n-type doped region 32 may be between about $10^{15}/cm^3$ and about $10^{18}/cm^3$ in accordance with some embodiments. Interface 32A between n-type doped region 32 and p-body 26A is substantially aligned to edge 30A1 of gate electrode 30A, and interface 32B between n-type doped region 32 and p-body 26B is substantially aligned to edge 30B1 of gate electrode 30B. However, the interface may be also expended toward gate electrodes after the thermal treatment that is performed after implantation, due to the outwardly diffusion of implantations.

Figure 1C:
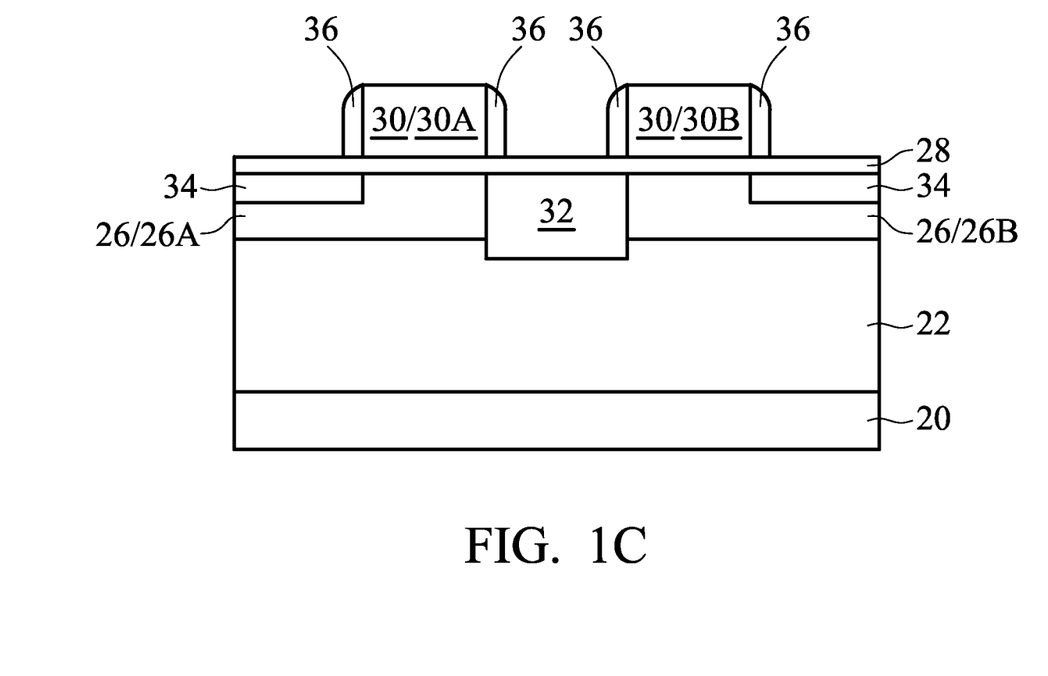

Referring to FIG. 1C, a further implantation is performed to form heavily doped n-type regions 34, which act as the source contact regions. N-type regions 34 may have an n-type impurity concentration between about $10^{19}/cm^3$ and about $10^{21}/cm^3$, for example. The bottom surfaces of n-type regions 34 are spaced apart from epitaxy layer 22 by portions of p-body 26. In a subsequent step, gate spacers 36 are formed on the sidewalls of gate electrodes 30A and 30B. The formation process may include depositing a dielectric layer, and then performing an anisotropic etching to remove the horizontal portions of the dielectric layer. The vertical portions of the dielectric layer on the sidewalls of gate electrodes 30A and 30B remain after the etching, and form gate spacers 36.

Figure 1D:
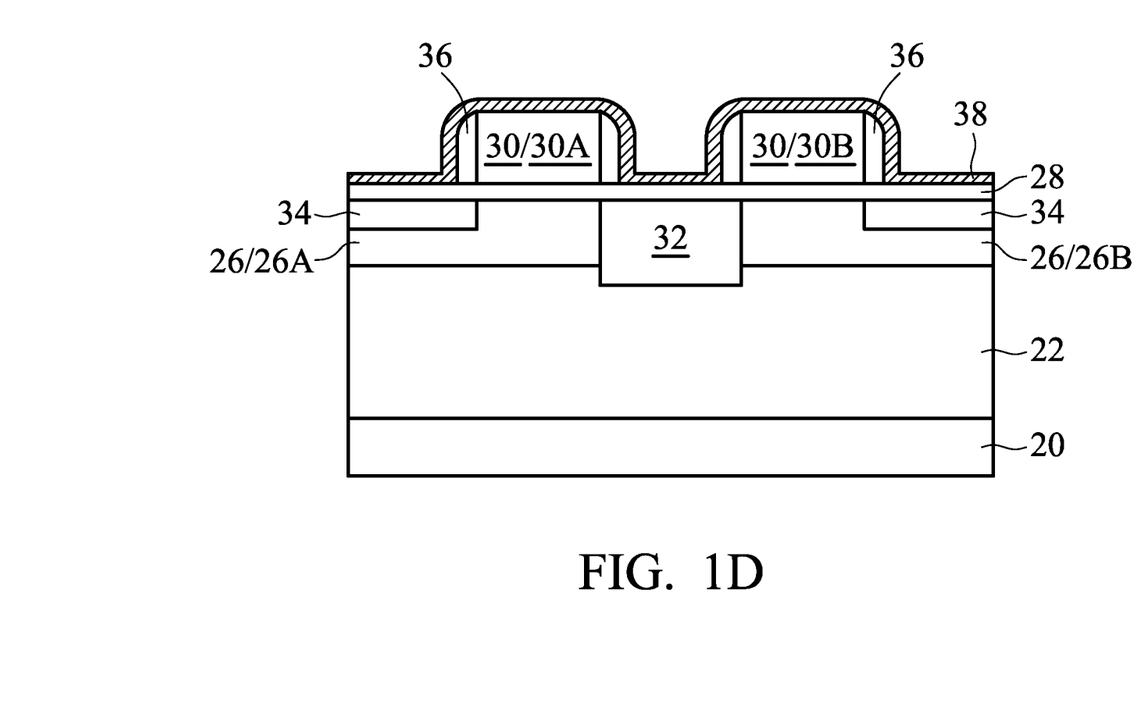

In FIG. 1D, dielectric layer 38 is formed over n-type regions 34, spacers 36, and gate electrodes 30A and 30B. In some embodiments, dielectric layer 38 are used as the etch stop layer in the formation of contact openings in subsequent steps, which contact openings are used for forming the contact plugs that are connected to gate electrodes 30A and 30B. Dielectric layer 38 may comprise an oxide, a nitride, an oxynitride, combinations thereof, and multi-layers thereof.

Figure 1E:
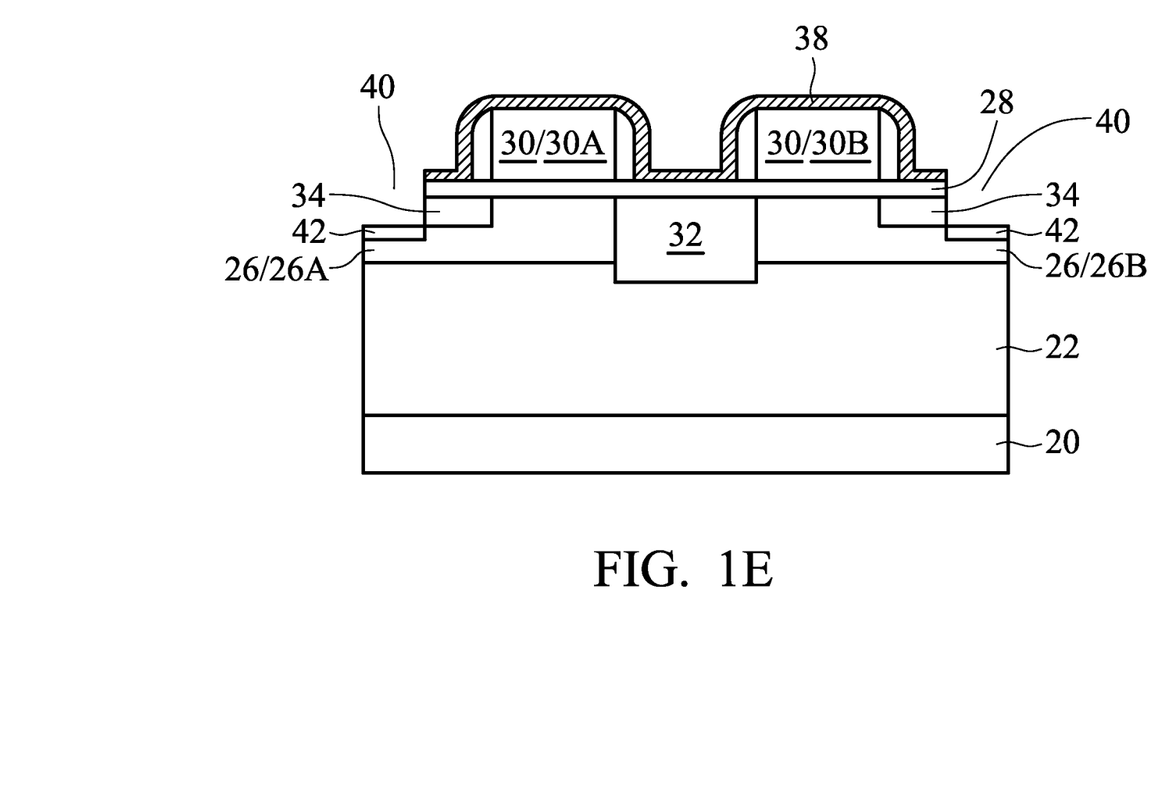

Next, referring to FIG. 1E, dielectric layer 38, gate dielectric layer 28, and portions of heavily doped n-type regions 34 are etched to form contact openings 40. After the contact opening formation, the sidewalls of heavily doped n-type regions 34 are exposed to contact openings 40, and the top surfaces of p-bodies 26A and 26B are also exposed. Next, a p-type impurity implantation is performed to form heavily doped p-type regions 42 in p-body regions 26. In some embodiments, the p-type impurity concentration in heavily doped p-type regions 42 is between about $10^{19}/cm^3$ and about $10^{21}/cm^3$. Heavily doped p-type regions 42 act as the pickup regions of p-bodies 26A and 26B.

Figure 1F:
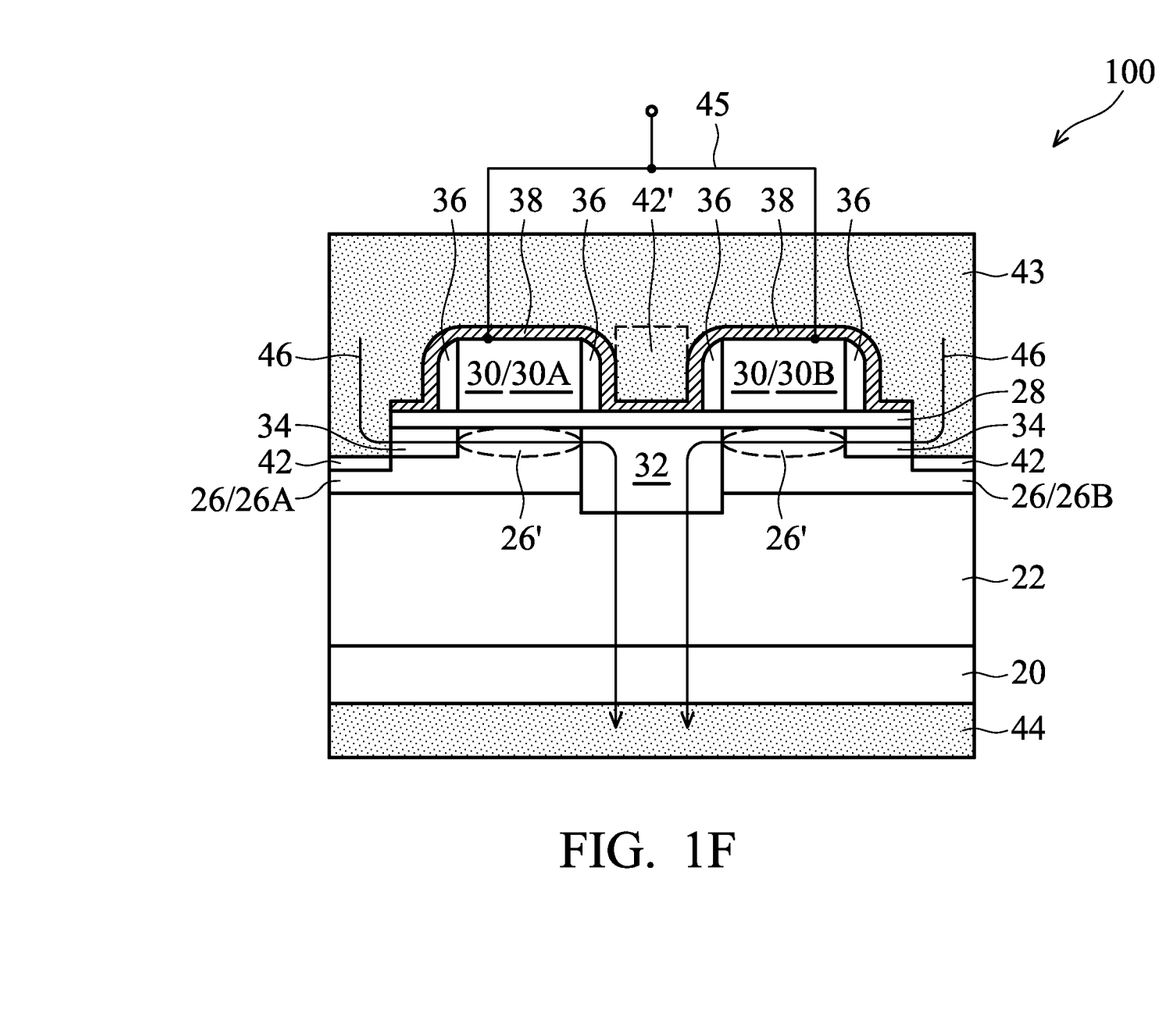

Referring to FIG. 1F, a conductive material is deposited to form source region 43. Source region 43 contacts the sidewalls of heavily doped n-type regions 34. Furthermore, a conductive material is deposited underneath heavily doped semiconductor region 20 to form drain region 44. Source regions 43 and drain region 44 are formed on the opposite sides of the respective wafer and chip. In some embodiments, source region 43 and drain region 44 are formed of a metal or a metal alloy such as aluminum, copper, tungsten, nickel, and/or the like. Vertical power MOSFET 100 is thus formed. Electrical connections 45 such as contact plugs, metal lines, and the like, are formed over, and connected to, gate electrodes 30A and 30B. Gate electrodes 30A and 30B are thus interconnected, and are at the same voltage level, and act as one gate.

An on-current of vertical power MOSFET 100 is schematically illustrated using curved lines 46, which pass through source region 43, heavily doped n-type regions 34, channel regions 26' in p-type bodies 26A and 26B, n-type doped region 32, epitaxy layer 22, semiconductor region 20, and reach drain region 44. It is appreciated that source region 43 comprises portion 42' extending into the space between gate electrodes 30A and 30B, and overlapping n-type doped region 32. Conductive portion 42' acts as a field plate that is connected to source region 43, and functions to reduce surface electrical fields in n-type doped region 32. As shown in FIG. 1F, gate oxide layer 28 includes a first portion overlapped by gate electrode 30A, a second portion overlapped by gate electrode 30B, and a third portion physically connecting the first portion of gate oxide layer 28 to the second portion of gate oxide layer 28. The third portion of gate oxide layer 28 is overlapped by portion 42' of source region 43.

Figure 2A:
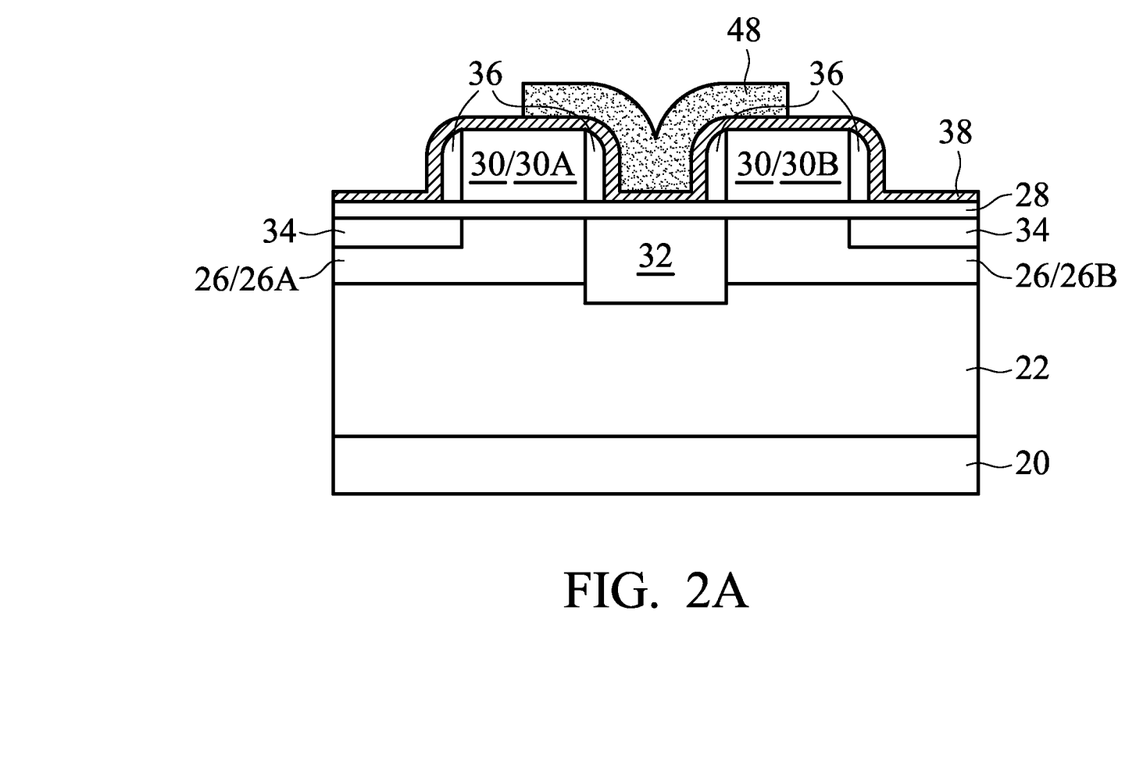
FIGS. 2A through 2C are cross-sectional views of intermediate stages in the manufacturing of a vertical power MOSFET in accordance with alternative embodiments.
Figure 2B:
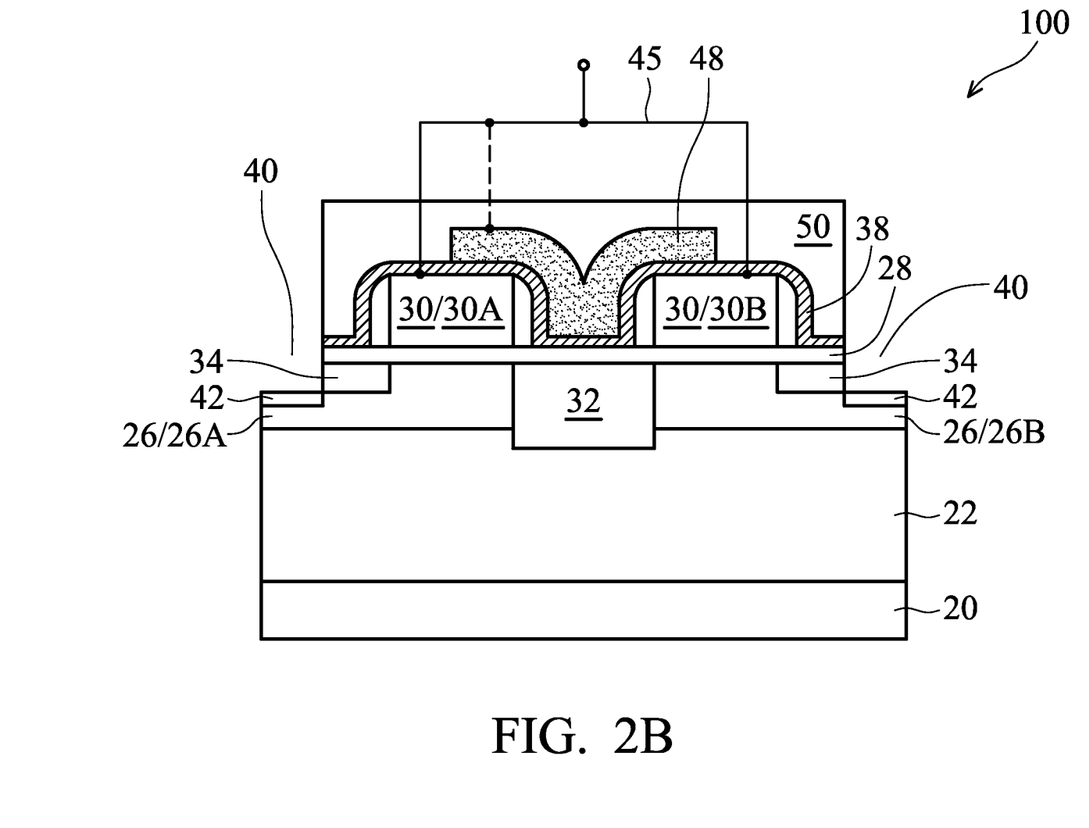
Figure 2C:
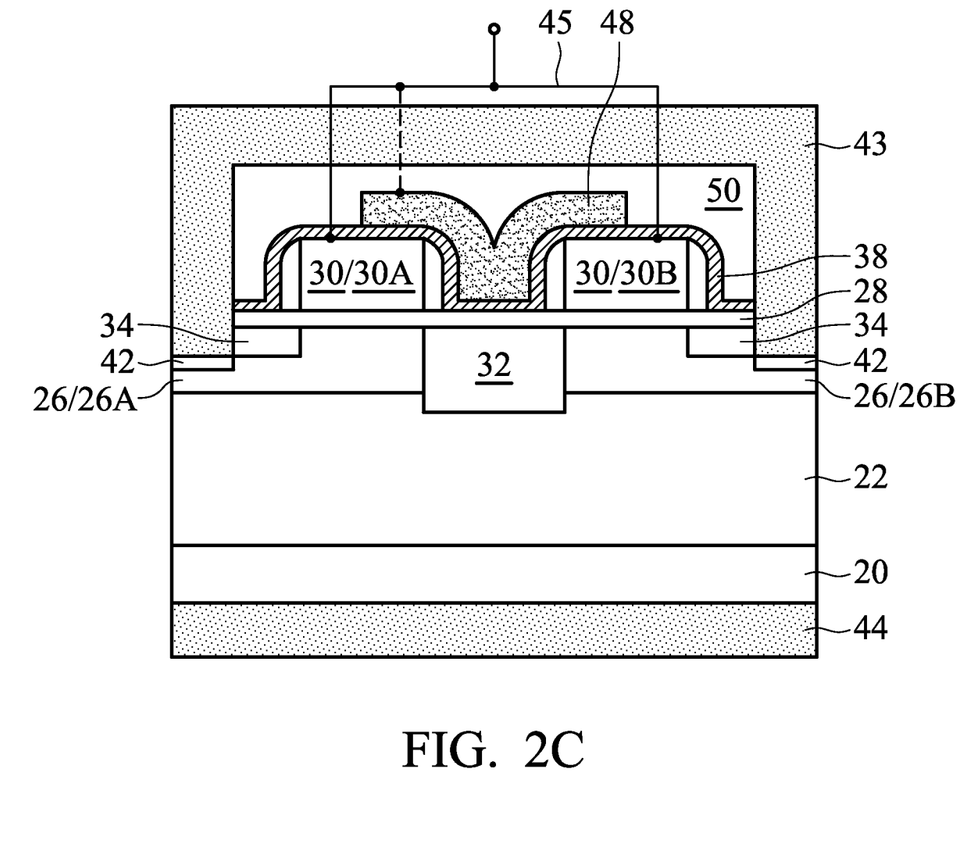

FIGS. 2A through 2C illustrate cross-sectional views of intermediate stages in the formation of a vertical power MOSFET in accordance with alternative embodiments. Unless specified otherwise, the materials and formation methods of the components in the embodiments in FIGS. 2A through 2C are essentially the same as the like components, which are denoted by like reference numerals in the embodiments shown in FIGS. 1A through 1F. The details of the like components shown in FIGS. 2A through 2C may thus be found in the discussion of the embodiment shown in FIGS. 1A through 1F.

The initial steps of these embodiments are essentially the same as shown in FIGS. 1A through 1D. Next, as shown in FIG. 2A, field plate 48 is formed. Field plate 48 is conductive, and may comprise polysilicon, a metal silicide, a metal, a metal alloy, or the like. Field plate 48 extends into the space between gate electrodes 30A and 30B, and overlaps n-type doped region 32. In some embodiments, field plate 48 extends over gate electrodes 30A and 30B, and overlaps a part of each of gate electrodes 30A and 30B. In alternative embodiments, field plate 48 does not extend over gate electrodes 30A and 30B. Field plate 48 functions to reduce the surface electrical field in n-type doped region 32. In some embodiments, field plate 48 is disconnected from the subsequently formed source region 43, and may be applied with a voltage different from the voltage of source region 43. In alternative embodiments, field plate 48 is connected to, and hence is at a same voltage level as, the subsequently formed source region 43.

Referring to FIG. 2B, Inter-Layer Dielectric (ILD) 50 is formed over the structure shown in FIG. 2A, and is over dielectric layer 38. ILD 50 may comprise Phospho-Silicate glass (PSG), Boro-Silicate Glass (BSG), Boron-Doped Phospho-Silicate Glass (BPSG), Tetra Ethyl Ortho Silicate (TEOS) oxide, or the like. ILD 50 may be formed as a blanket layer. Contact openings 40 are then formed by etching ILD 50, gate dielectric layer 28, and some portions of heavily doped n-type regions 34 to form contact openings 40. After the contact opening formation, the sidewalls of heavily doped n-type regions 34 are exposed, and the top surfaces of p-bodies 26A and 26B are also exposed.

Next, an implantation is performed to dope a p-type impurity through contact openings 40 and into p-bodies 26, so that heavily doped p-type regions 42 are formed in the surface regions of p-body 26. In a subsequent step, as shown in FIG. 2C, conductive materials are deposited to form source region 43 and drain region 44. Vertical Power MOSFET 100 is thus formed. The electrical connections 45, which are connected to gate electrodes 30A/30B and field plate 48 may be formed by forming contact plugs and metal lines. In some embodiments, field plate 48 is electrically coupled to, and at a same voltage as, source region 43. In alternative embodiments, field plate 48 is disconnected from source region 43, and is applied with a voltage separate from the voltage of source region 43.

In the embodiments, gate electrodes 30A and 30B do not overlap n-type region 32, which is electrically connected to drain region 44 through n-type epitaxy layer 22 and n-type region 20. Accordingly, the gate-to-drain capacitance is significantly reduced. Furthermore, since n-type region 32 is formed by implantation, and may be doped to a high impurity concentration, the resistance of n-type region 32 is reduced, and the drive current of vertical power MOSFET 100 is increased.

Although the embodiments shown in FIGS. 1A through 2C provide methods of forming n-type vertical power MOSFETs, one skilled in the art will realize that the provided teaching is readily available for the formation of p-type vertical power MOSFETs, with the conductivity types of the respective regions 20, 22, 26, 32, 34, and 42 inverted.

In accordance with embodiments, a device includes a semiconductor layer of a first conductivity type, and a first and a second body region over the semiconductor layer, wherein the first and the second body regions are of a second conductivity type opposite the first conductivity type. A doped semiconductor region of the first conductivity type is disposed between and contacting the first and the second body regions. A gate dielectric layer is disposed over the first and the second body regions and the doped semiconductor region. A first and a second gate electrode are disposed over the gate dielectric layer, and overlapping the first and the second body regions, respectively. The first and the second gate electrodes are physically separated from each other by a space, and are electrically interconnected. The space between the first and the second gate electrodes overlaps the doped semiconductor region.

In accordance with other embodiments, a device includes a semiconductor layer of a first conductivity type, a first and a second body region of a second conductivity type opposite the first conductivity type, and a doped semiconductor region of the first conductivity type between the first and the second body regions. The bottoms of the doped semiconductor region and the first and the second body regions are in contact with top surfaces of the semiconductor layer. A gate dielectric layer is over the first and the second body regions and the doped semiconductor region. A first and a second gate electrode are over the gate dielectric layer, and overlapping the first and the second body regions, respectively. The first and the second gate electrodes are physically separated from each other by a space, and are electrically interconnected. A source region includes portions over the first and the second body regions. A drain region is underlying the semiconductor layer.

In accordance with yet other embodiments, a method includes epitaxially growing an epitaxy semiconductor layer of a first conductivity type, and forming a semiconductor body layer over the epitaxy semiconductor layer. The semiconductor body layer is of a second conductivity type opposite the first conductivity type. A gate dielectric layer is formed over the semiconductor body layer. A first and a second gate electrode are formed over the gate dielectric layer, wherein the first and the second gate electrodes are spaced apart from each other by a space. A portion of the semiconductor body layer is implanted to form a doped semiconductor region of the first conductivity type, wherein the doped semiconductor region is overlapped by the space. The doped semiconductor region extends to contact the epitaxy semiconductor layer. A source region is over the semiconductor body layer. A drain region is underlying the epitaxy semiconductor layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor layer of a first conductivity type;
   a first and a second body region over the semiconductor layer, wherein the first and the second body regions are of a second conductivity type opposite the first conductivity type;
   a doped semiconductor region of the first conductivity type between and contacting the first and the second body regions;
   a gate dielectric layer over the first and the second body regions and the doped semiconductor region;
   a first gate electrode over the gate dielectric layer, wherein the first gate electrode comprises a first edge, and wherein the first gate electrode overlaps the first body region;
   a second gate electrode over the gate dielectric layer and electrically coupled to the first gate electrode, wherein the second gate electrode overlaps the second body region, wherein the second gate electrode comprises a second edge separated from the first edge by a space, with no additional gate electrode disposed between the first edge and the second edge, and wherein the space overlaps the doped semiconductor region; and
   a source region comprising:
      first portions over the first and the second body regions; and
      a second portion disposed in the space.

2. The device of claim 1, wherein the first and the second gate electrodes are comprised in a vertical power Metal-Oxide-Semiconductor Field Effect Transistor (MOSFET), and wherein the vertical power MOSFET further comprises:
   a drain region underlying the semiconductor layer.

3. The device of claim 1, wherein the second portion of the source region is level with the gate electrode.

4. The device of claim 2 further comprising:
   a conductive field plate disposed in the space between the first and the second gate electrodes; and
   an inter-layer dielectric over the conductive field plate.

5. The device of claim 1, wherein a first interface between the first body region and the doped semiconductor region is substantially aligned to the first edge of the first gate electrode, and wherein a second interface between the second body region and the doped semiconductor region is substantially aligned to the second edge of the second gate electrode, and wherein the first gate electrode and the second gate electrode comprise no additional edge between the first edge and the second edge.

6. The device of claim 1 further comprising a heavily doped semiconductor region of the first conductivity type, wherein the heavily doped semiconductor region and the doped semiconductor region are on opposite sides of, and contacting, the first body region.

7. The device of claim 6, wherein a sidewall of the heavily doped semiconductor region contacts a metal source region.

8. A device comprising:
   a semiconductor layer of a first conductivity type;
   a first and a second body region of a second conductivity type opposite the first conductivity type;
   a doped semiconductor region of the first conductivity type between the first and the second body regions, wherein bottoms of the doped semiconductor region and the first and the second body regions are in contact with top surfaces of the semiconductor layer;
   a gate dielectric layer over the first and the second body regions and the doped semiconductor region;
   a first gate electrode over the gate dielectric layer, wherein the first gate electrode comprises a first edge aligned to a first interface between the doped semiconductor region and the first body region;
   a second gate electrode over the gate dielectric layer and electrically coupled to the first gate electrode, wherein the second gate electrode comprises a second edge aligned to a second interface between the doped semiconductor region and the second body region, and wherein the first edge and the second edge are separated from each other by a space, with no additional gate electrode disposed between the first edge and the second edge;
   a source region comprising first portions over the first and the second body regions; and
   a drain region underlying the semiconductor layer.

9. The device of claim 8, wherein the doped semiconductor region has an impurity concentration higher than an impurity concentration of the semiconductor layer.

10. The device of claim 8, wherein the source region further comprises a second portion disposed in the space between the first and the second gate electrodes.

11. The device of claim 8 further comprising a conductive field plate disposed in the space between the first and the second gate electrodes, wherein the conductive field plate is spaced apart from the doped semiconductor region by the gate dielectric layer.

12. The device of claim 8 further comprising a heavily doped semiconductor region of the first conductivity type, wherein the heavily doped semiconductor region and the doped semiconductor region are on opposite sides of, and contacting, the first body region.

13. The device of claim 8, wherein a sidewall of the heavily doped semiconductor region contacts the source region.

14. The device of claim 1, wherein the gate dielectric layer comprises:
   a first portion overlapped by the first gate electrode;
   a second portion overlapped by the second gate electrode; and
   a third portion physically connecting the first portion to the second portion, wherein the second portion of the source region overlaps the third portion.

15. The device of claim 8, wherein substantially an entirety of the first gate electrode overlaps the first body region.

16. The device of claim 8, wherein the gate dielectric layer comprises:
   a first portion overlapped by the first gate electrode;
   a second portion overlapped by the second gate electrode; and
   a third portion physically connecting the first portion to the second portion, wherein the second portion of the source region overlaps the third portion.

17. A device comprising:
   a semiconductor layer of a first conductivity type;
   a first and a second body region of a second conductivity type opposite the first conductivity type;
   a doped semiconductor region of the first conductivity type between the first and the second body regions, wherein bottoms of the doped semiconductor region and the first and the second body regions are in contact with top surfaces of the semiconductor layer;
   a gate dielectric layer over the first and the second body regions and the doped semiconductor region;
   a first gate electrode over the gate dielectric layer, wherein the first gate electrode comprises a first edge aligned to a first interface between the doped semiconductor region and the first body region, and wherein an entirety of the first gate electrode overlaps the first body region;
   a second gate electrode over the gate dielectric layer and electrically coupled to the first gate electrode, wherein the second gate electrode comprises a second edge aligned to a second interface between the doped semiconductor region and the second body region, wherein the first edge and the second edge are separated from each other by a space, with no additional gate electrode disposed between the first edge and the second edge, and wherein the gate dielectric layer comprises:
   a first portion overlapped by the first gate electrode;
   a second portion overlapped by the second gate electrode; and
   a third portion physically connecting the first portion to the second portion;
   a source region comprising first portions over the first and the second body regions, wherein the second portion of the source region overlaps the third portion of the gate dielectric layer; and
   a drain region underlying the semiconductor layer.

18. The device of claim 17, wherein the doped semiconductor region has an impurity concentration higher than an impurity concentration of the semiconductor layer.

19. The device of claim 17, wherein the source region further comprises a second portion disposed in the space between the first and the second gate electrodes.

* * * * *